(12) United States Patent
Nakatsukasa et al.

(10) Patent No.: US 7,648,580 B2
(45) Date of Patent: Jan. 19, 2010

(54) SUBSTRATE PROCESSING METHOD AND SUBSTRATE PROCESSING DEVICE

(75) Inventors: Katsuyoshi Nakatsukasa, Okayama (JP); Kazuhisa Ogasawara, Okayama (JP); Yoshiaki Sakaihara, Okayama (JP); Yoshihiro Haruki, Okayama (JP); Munenori Kawate, Okayama (JP)

(73) Assignee: S.E.S. Co., Ltd., Tokyo (JP)

( * ) Notice: Subject to any disclaimer, the term of this patent is extended or adjusted under 35 U.S.C. 154(b) by 758 days.

(21) Appl. No.: 10/562,967

(22) PCT Filed: Dec. 2, 2003

(86) PCT No.: PCT/JP03/15430

§ 371 (c)(1),
(2), (4) Date: Dec. 29, 2005

(87) PCT Pub. No.: WO2005/004217

PCT Pub. Date: Jan. 13, 2005

(65) Prior Publication Data

US 2006/0162745 A1    Jul. 27, 2006

(30) Foreign Application Priority Data

Jul. 2, 2003    (JP) .............................. 2003-190654

(51) Int. Cl.
*B08B 3/12*    (2006.01)
*B08B 6/00*    (2006.01)
(52) U.S. Cl. .......................................... 134/1; 134/1.3
(58) Field of Classification Search .................. None
See application file for complete search history.

(56) References Cited

U.S. PATENT DOCUMENTS

| 5,351,419 | A | | 10/1994 | Franka et al. |
| 6,050,275 | A | | 4/2000 | Kamikawa et al. |
| 6,131,588 | A | * | 10/2000 | Kamikawa et al. ....... 134/102.3 |
| 6,510,859 | B1 | * | 1/2003 | Kamikawa .................. 134/61 |
| 6,864,186 | B1 | * | 3/2005 | Yates .......................... 438/745 |
| 7,107,701 | B2 | * | 9/2006 | Takemura et al. ............. 34/526 |

FOREIGN PATENT DOCUMENTS

| EP | 0 580 980 | 2/1994 |
| EP | 0 832 697 | 4/1998 |

(Continued)

*Primary Examiner*—Duy-Vu N Deo
(74) *Attorney, Agent, or Firm*—Westerman, Hattori, Daniels & Adrian, LLP

(57) ABSTRACT

A processing tank 10 is divided into a washing section 15 and a drying section 30, a clearance is formed in the joint between the sections, and the clearance is communicated with by sink 29. In drying a substrate, the substrate is moved from the washing section to the drying section, a porous plate 28 is inserted into the lower region where the clearance is formed, and a drying gas is jetted against the substrate with the internal pressure of the drying section 30 kept higher than that of the sink 29 and the internal pressure of the washing section 15 kept lower than that of the drying section 30. In this case, it is preferable that the porous plate 28 is a punched plate in which plural small holes having predetermined diameters have been made. The above configuration provides a substrate processing method and a substrate processing device in which the drying gas can uniformly and stably be supplied to an assembly of plural substrates.

4 Claims, 9 Drawing Sheets

FOREIGN PATENT DOCUMENTS

| | | |
|---|---|---|
| EP | 0 833 376 | 4/1998 |
| EP | 0 855 736 | 7/1998 |
| JP | 6-97149 | 4/1994 |
| JP | 10-154688 | 6/1998 |
| JP | 10-154689 | 6/1998 |
| JP | 10-209110 | 8/1998 |
| JP | 11-145103 | 5/1999 |
| JP | 11-307507 | 11/1999 |
| JP | 2002-118090 | 4/2002 |
| JP | 3560962 | 6/2004 |

* cited by examiner

SUBSTRATE PROCESSING METHOD AND SUBSTRATE PROCESSING DEVICE

TECHNICAL FIELD

The present invention relates to a substrate processing method and a substrate processing device, which can perform processing on a semiconductor wafer, a liquid crystal display device substrate, a recording disk substrate, a mask substrate, and other substrates, in particular it is a substrate processing method and substrate processing device which can perform within one processing tank a series of surface processes from the processing of various substrates with a chemical solution to the process of drying the substrates.

BACKGROUND ART

In the semiconductor production process, for various substrates, for example in order to clean a wafer surface, after the wafer surface is cleansed with a chemical solution, washing is performed using a processing solution such as pure water, and the wafer is dried with an organic solvent such as isopropyl alcohol (hereinafter referred to as IPA). More specifically, the processes includes a process, in which, after the wafer is cleansed with the chemical solution and pure water, the wafer is exposed in an IPA vapor to condense IPA on the wafer surface, thus substituting IPA for the pure water adhering to the wafer, and contaminants such as particles are washed from the wafer surface by running pure water down the wafer surface, and a drying process of vaporizing IPA to dry the wafer surface. In the drying process, if even a small droplet of water remains on the wafer surface, a water mark is formed on the wafer surface, which causes wafer quality to be worsened in the same way as a particle does. Therefore, in the semiconductor production process, it is necessary that such contaminants do not adhere to the wafer. Many methods and apparatus for processing the substrate surface of the wafer, in which measures are taken against contaminants, have been devised and put into practical use. Such methods and apparatus for processing the substrate are disclosed in many patent documents such as Japanese Patent Laid-Open No. 2001-271188 (see FIG. 1 and right column of page 5 to left column of page 6).

The substrate processing device described in Japanese Patent Laid-Open No. 2001-271188 includes one processing tank. The processing tank includes a bottomed box body and a lid. The box body has an open upper region. The opening of the box body is covered with the lid. The opening of the box body is formed to a size such that the many wafers can be supported and accommodated at predetermined intervals and in parallel and vertical orientation. The depth of the box body is formed to such extent that the upper space has an appropriate volume in which it is ensured an inert gas can be supplied when the wafers are dipped into it. The processes including the chemical-solution process, the process of washing out the chemical solution from the wafer surface using pure water, and the drying process of removing the water adhering to and remaining on the wafer surface with mixed substitution of the organic solvent vapor and the inert gas after the washing process is performed in the one processing tank.

When the flow of the inert gas within the processing tank was investigated during the wafer drying process, routes shown in FIG. 9 were observed. FIG. 9 is a sectional view schematically showing the flow of the inert gas within the processing tank. Substrate processing device 1 includes a processing tank 2 with an inner tank $2_1$, an outer tank $2_2$, and a lid $2_3$. The outer tank $2_2$ has a bottomed box shape and an open upper region. The inner tank $2_1$ surrounds the outer periphery in the upper region of the inner tank $2_1$. An openable and closable lid $2_3$ is provided in the upper region of the outer tank. A processing solution discharge hole $2_{12}$ is made in a bottom region of the inner tank $2_1$. One end of the exhaust pipe 5 is connected to the processing solution discharge hole $2_{12}$, and the other end of the exhaust pipe 5 is coupled to a vacuum pump or the like. Vapor ejection ports 8 are protruded in the outer tank $2_2$, and the vapor ejection ports 8 are coupled to a vapor supply mechanism 9. Gas jet nozzles $4_1$ are mounted in the upper region of the lid $2_3$, and the gas jet nozzles $4_1$ are connected to a nitrogen gas supply source 7 through piping 4.

In the substrate processing device 1, when the nitrogen gas $N_2$ (drying gas) from the nitrogen gas supply source 7 is jetted from the upper region of the processing tank 2, the jetted nitrogen gas $N_2$ flows downward, and the nitrogen gas $N_2$ is jetted onto an assembly of wafers W', and the nitrogen gas $N_2$ is exhausted outside the tank from an exhaust pipe 5. At this point, some of the jet gas is exhausted outside the sink 3 through the space between the outer tank $2_2$ and the lid $2_3$. The outside of the sink 3 is at atmospheric pressure. As shown by arrows in FIG. 9, the gas jetted onto the assembly of wafers W' collides with the bottom wall surface of the inner tank $2_1$ and rises to circulate in the processing tank 2, and then the gas is exhausted from the exhaust pipe 5. The surfaces of the assembly of wafers W' are dried by the gas directly jetted from the jet nozzles $4_1$ and by the gas circulating the inside of the processing tank 2.

DISCLOSURE OF THE INVENTION

However, in the substrate processing device described in Japanese Patent Laid-Open No. 2001-271188, since some of the drying gas is exhausted from the exhaust pipe while circulating the inside of the processing tank, the flow of the drying gas is not kept constant in the processing tank, and the flow of the drying gas becomes turbulent. As a result, the nitrogen gas is not uniformly supplied to individual wafers generating unevenness in the processing of the substrate surface. The turbulent state increases as the amount of drying gas is increased, which enlarges the unevenness of the processing. Therefore, stable surface processing cannot be performed. Further, since only one processing solution discharge hole is made in the bottom region of the inner tank, it is found that the turbulence becomes violent in the tank when the flow rate of the drying gas is increased, e.g., when the flow rate becomes about 100 L/min. It is believed that one of the causes of the turbulence is that the processing tank is not divided into a drying section and a washing section.

On the other hand, when the exhaust processing facility to which the exhaust pipe is connected was investigated, it was found that the cause of the turbulence is also attributed to the exhaust processing facility. Usually the exhaust pipe from the substrate processing device is connected to the exhaust processing facility. In the exhaust processing facility, a vacuum pump is used, and plural instruments and devices are connected to the pump to manage the exhaust processing in a collective manner. Therefore, it is difficult to finely adjust the instruments and devices individually in consideration of the requirements of each of the instrument and device, and facility cost is increased when individual adjustment is performed for each instrument and device. Further, in the usual exhaust processing facility, fluctuation in pressure of the evacuating station becomes intense during the initial stage of start-up or during stopping the exhaust processing facility. Therefore, in order to process a large amount of wafers while maintaining high quality, it is necessary to minimize the influence of the evacuating station in the exhaust processing facility. However, in the substrate processing device described in Japanese Patent Laid-Open No. 2001-271188, it is very difficult to perform this adjustment.

Recently, for the wafers processed by this kind of substrate processing device, in order to increase processing efficiency, it is necessary that as many wafers as possible are inserted into the processing tank while being held by a lifting mechanism. In some cases, the wafers are simultaneously processed in the processing tank in lot units ranging from 50 to 100 wafers, and the distance between the substrates tends to be narrowed to as small as several millimeters because the substrates are supported in a parallel and vertical orientation. Thus, when a large amount of substrates are processed with the chemical solutions in the processing tank, or when the rinsing process is performed on a large amount of substrate using pure water, it is necessary that the processing solution is supplied to the inside of the processing tank while the large amount of substrate is inserted in the processing tank, or it is necessary that the processing solution is substituted for another processing solution while the large amount of substrate is inserted in the processing tank. At this point, processing speeds on the substrates fluctuate and a long time is required for drying, so that there is the problem that particles and the like are easily generated.

In view of the foregoing, the invention is particularly to solve the problem in the drying process in the conventional art, and the first object of the invention is to provide a substrate processing method which can uniformly and stably supply the drying gas to the assembly of plural substrates.

The second object of the invention is to provide a substrate processing device which decreases contaminants adhering to the substrate surface and prevents a decrease in yield caused by contamination when a large amount of substrates is processed.

The above objects can be achieved by the following means. That is, the substrate processing method of the invention is characterized by including: dividing a processing tank into a washing section and a drying section; forming a clearance in the joint between the washing section and the drying section; communicating the clearance with a sink; moving the substrate from the washing section to the drying section when drying the substrate; inserting a porous plate into the lower region where the clearance is formed; and jetting a drying gas against the substrate with the internal pressure of the drying section kept higher than that of the sink and the internal pressure of the washing section kept lower than that of the drying section. According to the substrate processing method, in drying the substrate, after the drying gas is supplied to a group of substrates in the drying section, some of the drying gas flows to the sink through the clearance, and the remainder of the drying gas is exhausted to the outside through the washing section. At this point, since the internal pressure of the drying section is securely higher than that of the drying section, the down-flow of the drying gas becomes smooth in the washing section, which allows the surface processing of the group of plural substrates to be efficiently performed by the laminar flow of the drying gas.

The substrate processing method of the invention is characterized in that a processing solution supply unit and a processing solution discharge unit are independently provided in the bottom region of the washing section, and the following processes (a) to (d) are performed in washing the substrate: (a) a process of supplying a chemical solution from the processing solution supply unit into the processing tank to reserve the chemical solution in the processing tank; (b) a process of inputting and dipping the substrate in the processing tank to perform chemical-solution processing on the substrate for a predetermined time; (c) a process of supplying a washing solution from the processing solution supply unit after the chemical-solution processing is finished, and of discharging the chemical solution from the processing tank through the processing solution discharge unit; and (d) a process of stopping the supply of the washing solution after the chemical solution has been discharged.

According to the substrate processing method, since the series of processes such as the chemical-solution process, the washing process, and the drying process can be performed in the same processing tank, the substrate is never exposed to the air during the series of processes. Accordingly, the efficiency of the substrate processing is improved, the formation of a natural oxide film can be suppressed, and the contamination caused by particles can be prevented.

It is preferable that a drain mechanism is provided in the processing solution discharge unit and, in drying the substrate, the processing solution in the washing section is discharged for a short time by operating the drain mechanism at the same time as when the porous plate is inserted between the washing section and the drying section. It is also preferable that the porous plate is a punched plate in which plural small holes of a predetermined diameter have been punched.

According to the substrate processing method, while the drying gas is dispersed by the small holes of the punched plate, the internal pressure of the drying section can securely become higher than that of the washing section. The large amount of processing solution in the washing section is rapidly discharged by the operation of the drain mechanism, which smoothes the down-flow of the drying gas in the drying section. Therefore, surface processing of the group of plural substrates can efficiently be performed by the laminar flow of the drying gas.

The substrate processing device of the invention which includes support means for supporting plural substrates to be processed at equal pitches in parallel and vertical orientation; a washing processing tank which accommodates an assembly of substrates supported by the support means; and a lid with which the upper opening of the washing processing tank is covered, the lid also functioning as a drying processing tank, the substrate processing device is characterized in that the lid includes a container having a size in which the assembly of substrates can be accommodated, the top surface of the container being closed and a lower region of the container being opened, plural jet nozzles are arranged in a matrix shape at substantially equal intervals in the top surface of the container while respective jet-nozzle holes are orientated toward the assembly of substrates, and, when the upper opening of the washing processing tank is covered with the lid, the clearance communicated with the sink is formed between the washing processing tank and the lid, and the porous plate is inserted into the lower region of the clearance.

According to the substrate processing device, in drying the substrate, after the drying gas has been supplied to a group of the plural substrates in the drying processing tank, some of the drying gas flows to the sink through the clearance, and the remaining gas is exhausted to the outside through the washing processing tank. At this point, since the internal pressure of the drying processing tank is securely higher than that of the washing section, the down-flow of the drying gas becomes smooth in the drying processing tank, which allows the surface processing of the group of plural substrates to be efficiently performed by the laminar flow of the drying gas.

It is preferable that the washing processing tank includes a processing solution discharge unit and a processing solution supply unit which are independently provided in the bottom region of the washing processing tank; processing solution supply system piping which is connected to the processing solution supply unit to supply a processing solution to the processing tank; a chemical solution supply source which supplies the chemical solution to the processing solution supply system piping; washing solution supply means for supplying a washing solution to the processing tank through the processing solution supply system piping, the washing solution supply means for washing the substrate by causing the washing solution to overflow from the upper region of the processing tank; and discharge piping which is connected to the processing solution discharge unit to introduce the washing solution, discharged from the processing tank, to the outside of the processing tank.

Due to the construction of the substrate processing device, since the series of processes such as the chemical-solution process, the washing process, and the drying process can be performed in the same processing tank, the substrate is never exposed to the air during the series of processes. Accordingly, the efficiency of the substrate processing is improved, the formation of the natural oxide film can be suppressed, and the contamination caused by the particles can be prevented.

It is preferable that a drain mechanism is provided in the processing solution discharge unit and, in drying the assembly of substrates, the drain mechanism is operated at the same time as the porous plate is inserted between the washing processing tank and the lid. It is preferable that the plural jet nozzles are positioned in the top surface of the container along the outer circumference of the assembly of substrates such that distances between the outer circumference and respective nozzle holes become substantially equal to one another. It is preferable that the porous plate includes a punched plate with plural holes of a predetermined diameter.

Due to the substrate processing device, the drying gas can uniformly and stably be supplied to an assembly of substrates.

BEST MODE FOR CARRYING OUT THE INVENTION

Figure 1:
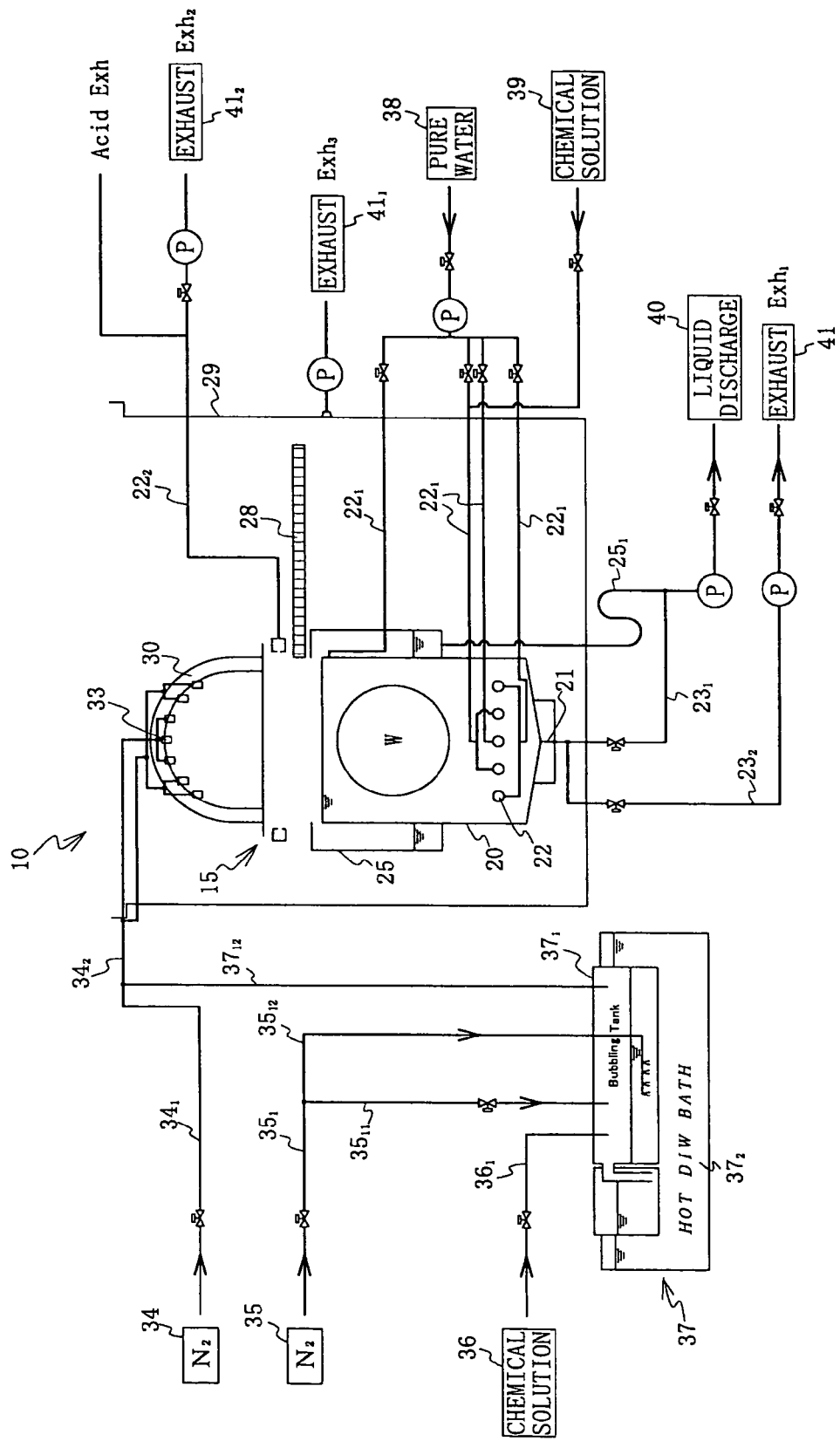
FIG. 1 is a sectional view showing the substrate processing device in accordance with the embodiment of the invention.

The preferred embodiment of the invention will be described below with reference to the drawings. The invention is not limited to the mode illustrated in the drawings.

Referring to FIG. 1, the substrate processing device 10 is a facility for processing the semiconductor wafer W which is of an example of possible substrates. The term of processing shall include the process of etching the wafer W with the chemical solution, the process of applying hydrofluoric acid treatment to the surface of the wafer W, the rinsing process of washing the wafer W, the drying process of drying the post-washed wafer W with the organic solvent, and the like. This series of processes is continuously performed in one processing tank 15.

As shown in FIGS. 2 to 5, the processing tank 15 is placed in a housing chamber 11 which has a volume such that the processing tank 15 and accessories thereof can be accommodated. These accessories include an air conditioning device which performs air conditioning in the accommodation chamber, a supply source which supplies various processing solutions to the processing tank, and a wafer conveying mechanism. The accessories are omitted in the drawings. The processing tank 15 includes an inner tank 20, an outer tank 25, and a lid 30. The inner tank 20 is formed in a bottomed box shape, and the upper surface of the inner tank 20 is open. The outer tank 25 surrounds the upper outer periphery of the inner tank 20. The opening of the inner tank 20 is covered with the lid 30. The inner and outer tanks 20 and 25 are accommodated in a sink 29. The inner and outer tanks 20 and 25 are made of a material which is corrosion-resistant to the organic solvent such as hydrofluoric acid and IPA, e.g. made from polyvinylidene fluoride or the like.

The inner tank 20 has a depth in which the processing can be performed by dipping a large number of wafers W with a large diameter, e.g., about 50 wafers W with a diameter of 300 mm in the processing solution while being held by a substrate holder 62. The processing solution discharge unit 21 and a processing solution supply unit 22 are provided in the bottom region of the inner tank 20. In the substrate holder 62, the plural wafers W are held by, e.g., a cassette guide at equal pitches and in parallel and vertical orientation. The substrate holder (cassette guide) 62 is coupled to a lifting mechanism 60. The lifting means 61 is provided in the lifting mechanism 60, and the cassette guide 62 is taken out from and put into the inner tank 20 by vertically moving the cassette guide 62 with the lifting means 61. The position of the drying process is indicated by "Dry Position" of FIG. 2, and the position of the washing process is indicated by "Rinse Position." For example, an air cylinder mechanism can be used as the lifting means 61.

Figure 2:
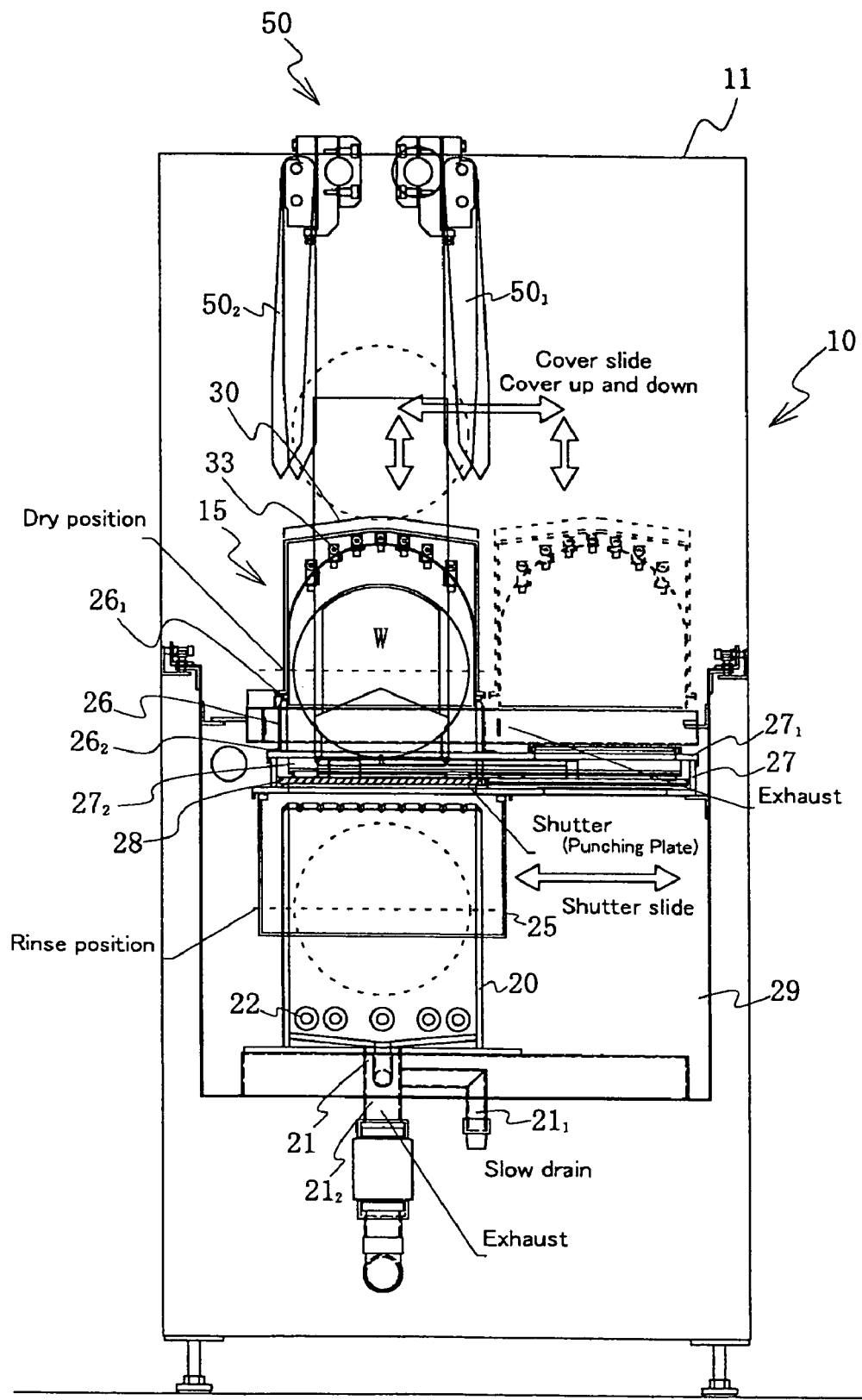
FIG. 2 is a side view showing the processing tank.

The assembly of wafers is taken out from the cassette guide 62 by the moving mechanism 50. The moving mechanism 50 includes plural holding pawls $50_1$ and $50_2$ coupled to a robot mechanism (not shown), and the assembly of wafers is held and moved to a predetermined position by the holding pawls $50_1$ and $50_2$. As shown in FIG. 2, the processing solution discharge unit 21 includes an outlet $21_1$ with a small diameter and an outlet $21_2$ with a large diameter. The outlet $21_2$ having the large diameter functions as a drain mechanism which rapidly discharges the processing solution in the processing tank. The outlet $21_1$ having the small diameter discharges the processing solution reserved in the bottom region of the inner tank 20 and in the piping. The outer tank 25 functions as an overflow tank which receives the processing solution overflowing from the upper region of the inner tank 20. An outlet $25_1$ is provided at a lower position of the outer tank 25.

Figure 5:
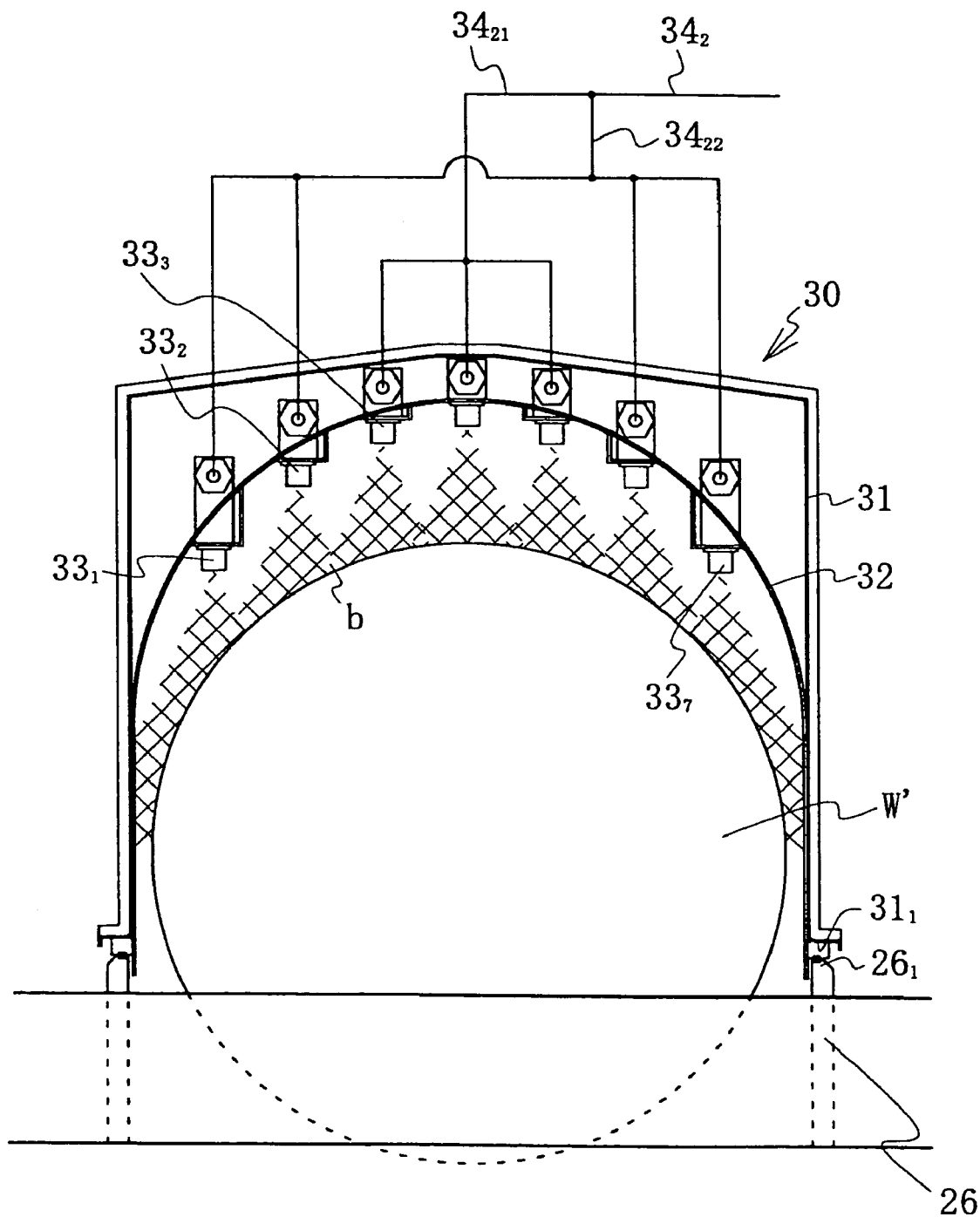
FIG. 5 is a side view of the lid shown in FIG. 4.

As shown in FIG. 5, the lid 30 includes a box-shaped container 31. In the box-shaped container 31, the lower region is opened and the upper region is closed. An assembly of wafers W' in which many wafers W are collected can be housed in the box-shaped container 31. The box-shaped container 31 is made of the material that is corrosion-resistant to the organic solvent such as hydrofluoric acid and IPA. The lid 30 can be moved horizontally by moving means 55 (see FIG. 3). The moving means 55 can close and open the opening of the inner tank 20 by horizontally moving the lid 30 above the inner tank 20 as shown by the arrow in FIG. 2. That is, the moving means 55 vertically lifts up the lid 30 located on the inner tank 20 by a predetermined distance, the moving means 55 horizontally moves the lid 30, and then the moving means 55 vertically lowers the lid 30 to hold the lid 30 in the standby state. The lid 30 is moved when the assembly of wafers W' is conveyed into the inner tank 20 or when the assembly of wafers which is already processed is taken out from the inner tank 20.

Figure 4:
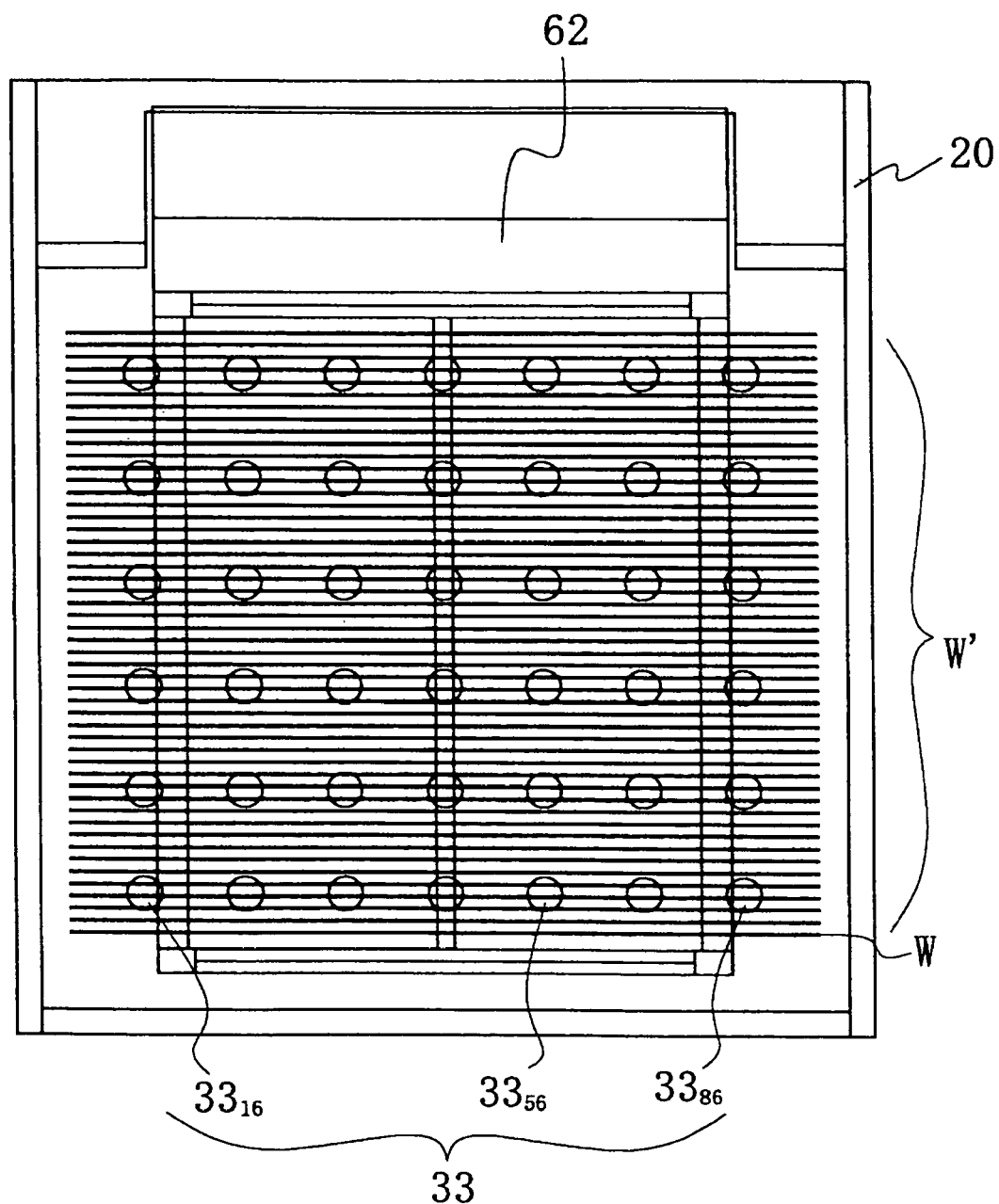
FIG. 4 is a perspective plan view showing the lid when viewed from an upper side.

As shown in FIG. 5, the top surface 32 which basically has an arch shape is formed in the upper region of the box-shaped container 31. In the top surface 32, plural jet nozzles $33_1$ to $33_7$ which jet the inert gas are arranged in four directions at substantially equal intervals. As shown in FIG. 4, in the plural nozzles 33 located above the assembly of wafers W', the plural jet nozzles $33_1$ to $33_7$ are arranged in a vertical column at substantially equal intervals, and the plural jet nozzles $33_1$ to $33_7$ are also arranged in a horizontal row at substantially equal intervals. Referring to FIG. 4, the six rows of the jet nozzles, in which the seven jet nozzles $33_1$ to $33_7$ are arranged in the column direction, are arranged in the row direction, and the 42 jet nozzles $33_1$ to $33_{86}$ are arranged in an outer circumference in the upper region of the assembly of wafers W'. As shown in FIG. 5, the seven jet nozzles $33_1$ to $33_7$ in the vertical column and, the jet nozzles $33_1$ to $33_7$ in the top surface 32 are arranged in relation to the assembly of wafers W' such that distances between the jet nozzles $33_1$ to $33_7$ and the outer circumferences of the assembly of wafers W' are equal to one another. Because the wafer W is basically formed in a circle, the distances can easily be equalized by making the top surface 32 arch shaped. It is preferable that the shape of the top surface is changed to substantially equalize the distances according to the shape of the wafer W.

The gas supply pipe $34_2$ is connected to each respective jet nozzle 33, and the gas supply pipe $34_2$ is branched into branch pipes $34_{21}$ and $34_{22}$. The same number of jet nozzles 33 or the substantially similar number of jet nozzles 33 is connected to each of the branch pipes $34_{21}$ and $34_{22}$. Therefore, the gas can substantially be uniformly distributed to each jet nozzle. Each respective jet nozzle in which the jet gas is diffused at a predetermined angle is used as the jet nozzle 33. When the gas is injected from each respective jet nozzle 33 to the outer circumference of the assembly of wafers, it is preferable that the jet nozzles 33 are set such that they inject gas between the adjacent jet nozzles, e.g., the gas jetted from the jet nozzle $33_2$ and the gas jetted from the jet nozzle $33_3$ overlap each other in the outer circumference b of the assembly of wafers. The plural jet nozzles 33 are arrayed in the top surface 32, which allows the gas to substantially be uniformly supplied to the assembly of wafers W.

Figure 3:
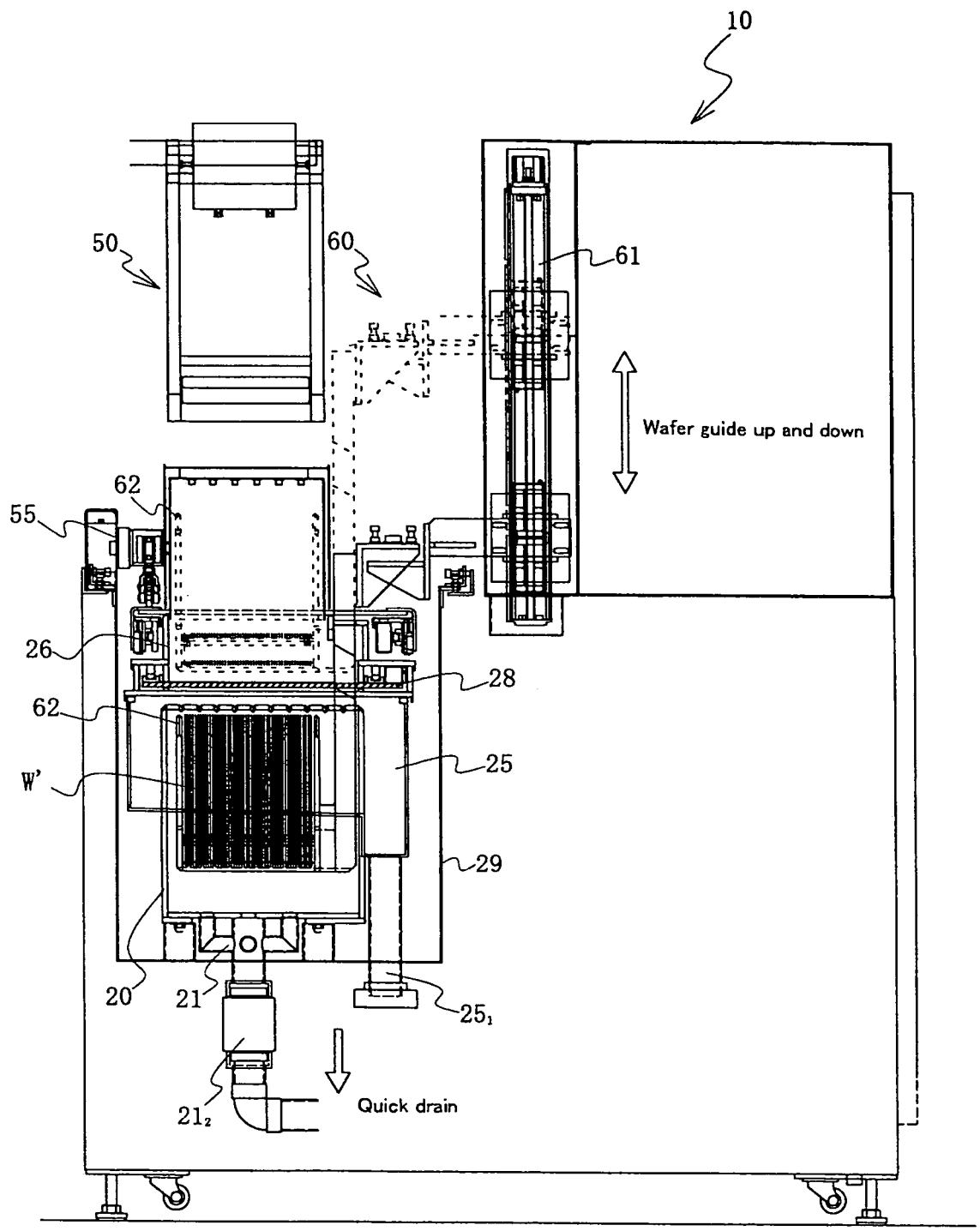
FIG. 3 is a side view showing the processing tank of FIG. 2 when viewed from the other side.

As shown in FIGS. 2, 3, and 5, the intermediate connecting member 26 and the porous plate inserting mechanism 27 are arranged between the inner and outer tanks 20 and 25 and the lid 30. The intermediate connecting member 26 is formed of a cylindrical body whose opening has the same size as the lower opening of the lid 30. The cylindrical body is made of a material which is corrosion-resistant to the organic solvent such as hydrofluoric acid and IPA. The intermediate connecting member 26 is positioned above the porous plate inserting mechanism 27. In the intermediate connecting member 26, the lower opening $26_2$ is positioned so as to substantially abut on the upper surface of the frame body $27_1$ in which the porous plate 28 is housed, and an upper opening $26_1$ is fitted in the lower opening $31_1$ of the box-shaped container 31. The intermediate connecting member 26 may be omitted by directly fitting the lid 30 in the frame body $27_1$.

The porous plate 28 includes a flat plate in which plural small holes have been made in the plate surface. The flat plate is inserted between the inner and outer tanks 20 and 25 and the intermediate connecting member 26 in the process of drying the assembly of wafers W' after the predetermined processes are finished. The porous plate is made of a material which is corrosion-resistant to the organic solvent such as hydrofluoric acid and IPA. The porous plate 28 is housed in the frame body $27_1$. The porous plate 28 is coupled to the moving mechanism (not shown) and horizontally moved in a sliding manner as shown in FIG. 2. The frame body $27_1$ housing the porous plate 28 has a predetermined longitudinal width (vertical direction), and a clearance $27_2$ is made between the frame body $27_1$ and the porous plate 28 when the porous plate 28 is housed in the frame body $27_1$.

For example, the clearance $27_2$ is about 2 mm. In the drying process, some of the dry gas is emitted into the sink 29. Therefore, since a clearance x is formed between the inner tank 20 and the lid 30 (clearance is expressed by x in FIG. 8), a half-closed state is formed between the inner tank 20 and the lid 30 by the clearance x, i.e., the half-closed state is formed between the drying section and the washing section. The porous plate 28 is inserted between the inner and outer tanks 20 and 25 and the intermediate connecting member 26 to divide the inner tank from the lid, namely, the porous plate 28 functions as a shutter which partitions the processing tank 10 into a washing section and a drying section.

Now the piping connection between the processing tank and accessories will be described with reference to FIG. 1. A pipe $22_1$ carrying the processing solution is connected to the processing solution supply unit 22 positioned in the bottom region of the inner tank 20. The pipe $22_1$ carrying the processing solution is connected to a pure water supply source 38 through a flow control valve and a pump. The pipe $22_1$ carrying the processing solution has the function of supplying the processing-solution, and the washing solution supply means includes this piping, the flow control valve, and the pump. A chemical solution supply source 39 is also connected to the processing solution introducing pipe $22_1$ through the flow control valve. The chemical solution supply source 39 includes a chemical preparation means (not shown) for preparing the desired chemical solution to a predetermined concentration and at a predetermined temperature. According to the purpose of the processing (for example, washing, etching, and oxidation), for example, the chemical solution can be selected from among hydrofluoric acid, hydrochloric acid, hydrogen peroxide solution, sulfuric acid, ozone water, ammonia water, surfactant, amine organic solvent, fluorine organic solvent, deionized water, etc. The solution in which the above plural chemical solutions are mixed is used as needed.

As shown in FIG. 2, the processing solution discharge unit 21 provided in the bottom region of the inner tank 20 includes the outlet $21_1$ which has a small diameter and the outlet $21_2$ which has a large diameter. The outlet $21_1$ and the outlet $21_2$ are connected to inner-tank liquid discharge pipes $23_1$ and $23_2$ respectively. The liquid discharge pipe $23_1$ is connected to a drain processing facility 40 through an on-off valve, the pump, and the flow control valve. Similarly the liquid discharge pipe $23_2$ is connected to an exhaust processing facility 41 through the on-off valve, the pump, and the flow control valve. The sink 29 is also connected to the exhaust processing facility $41_1$. The drain pipe $25_1$ is connected to the lower position of the outer tank 25, and the drain pipe $25_1$ is connected to the liquid discharge pipe $23_1$.

The vapor supply mechanism 37 is provided near the processing tank 15. The vapor supply mechanism 37 includes a vapor generation unit $37_1$. The vapor generation unit $37_1$ reserves the organic solvent such as the isopropyl alcohol (IPA) solvent. The organic solvent such as the IPA solvent easily mixes with the water remaining on and adhering to the surface of the wafer W, and this organic solvent has extremely little surface tension. The vapor generation unit $37_1$ heats the organic solvent to vaporize it. The vapor generation unit $37_1$ is dipped in hot water in a heating tank $37_2$, and the organic solvent is heated and vaporized. The vapor generation unit $37_1$ and the organic solvent (IPA) supply source 36 are connected to each-other by piping $36i$, and IPA is supplied to the vapor generation unit $37_1$.

The vapor generation unit $37_1$ and a second nitrogen gas $N_2$ supply source 35 are connected by branch piping $35_{11}$ and branch piping $35_{12}$. The nitrogen gas $N_2$ is supplied from the branch piping $35_{12}$ to the bottom region of the vapor generation tank $37_1$ to generate bubbles in IPA reserved in the vapor generation tank $37_1$, which accelerates evaporation of IPA. The nitrogen gas $N_2$ supplied from the branch piping $35_{11}$ is utilized as a carrier gas. The vapor generation tank $37_1$ is coupled to piping $34_2$ through piping $37_{12}$, and the mixed gas of the carrier gas $N_2$ and the IPA vapor are supplied from the vapor generation tank $37_1$ to the jet nozzles 33. A first nitrogen gas $N_2$ supply source 34 supplies the nitrogen gas $N_2$ to the jet nozzles 33 through piping $34_1$ and piping $34_2$. The nitrogen gas $N_2$ supplied from the first nitrogen gas $N_2$ supply source 34 is used not only for purging the inside of the processing tank 15 but also for finish drying.

Figure 6:
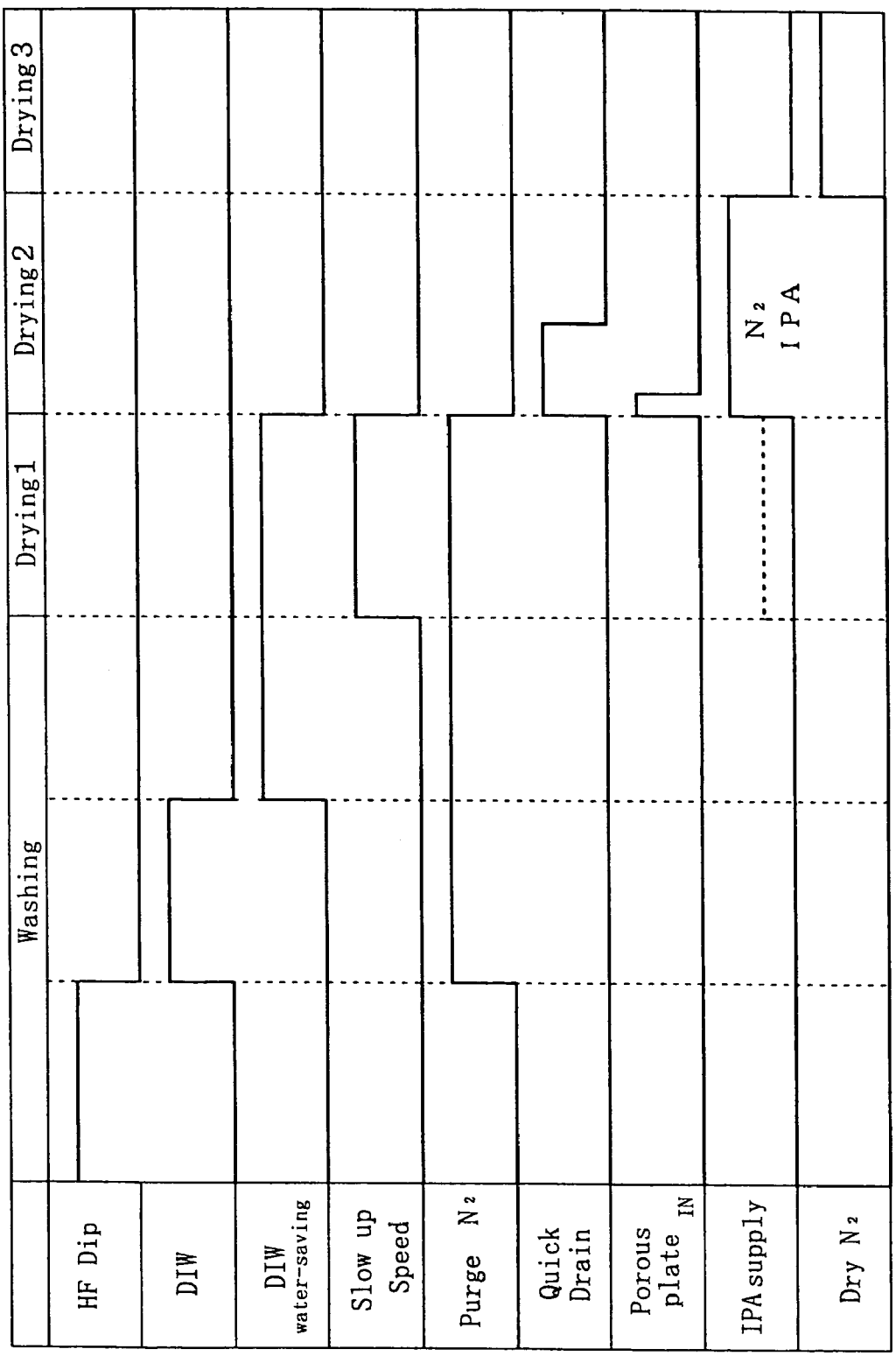
FIG. 6 is a table showing the timing chart for the steps in the processes.
Figure 7:
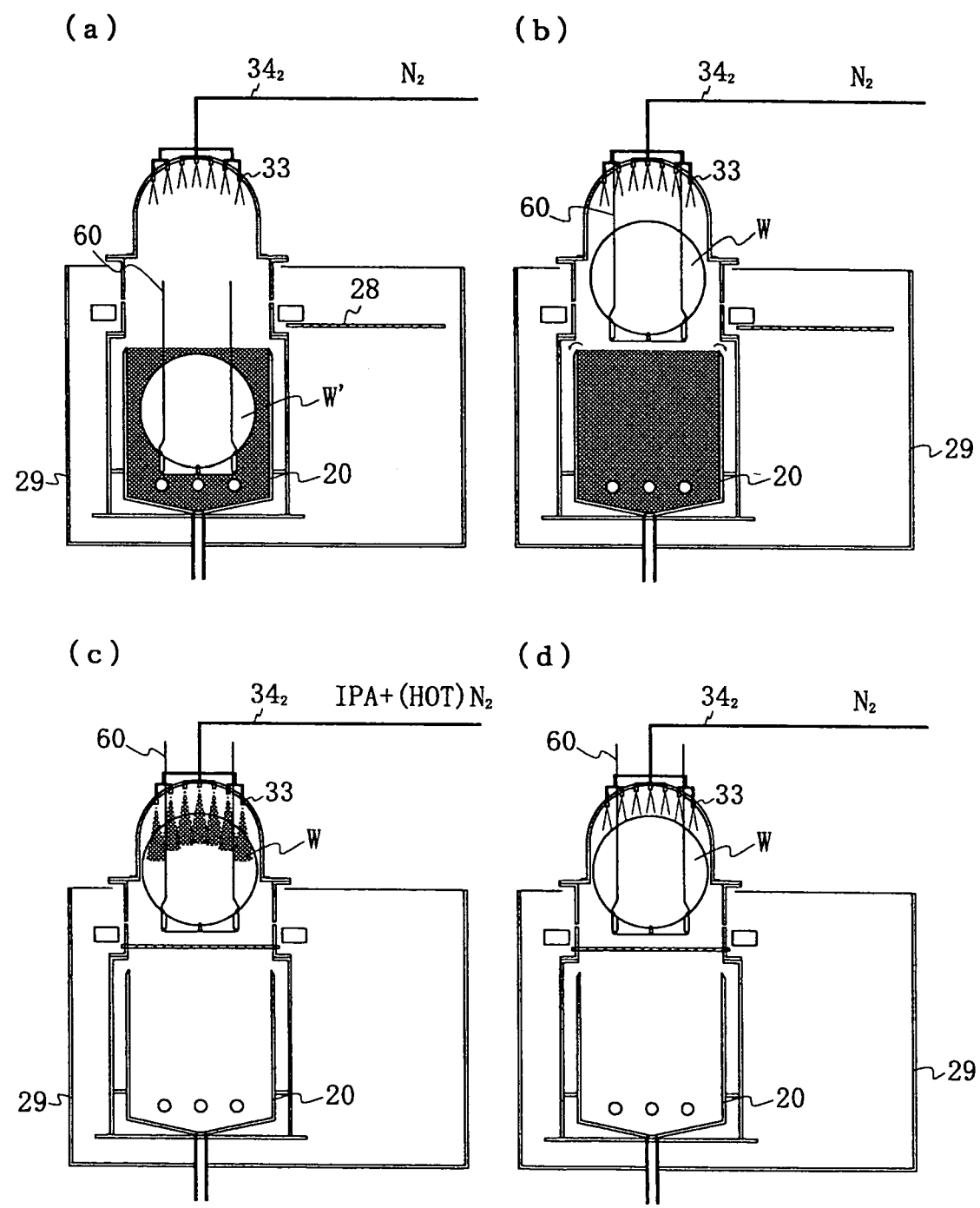
FIG. 7 shows the washing and drying process, FIG. 7(*a*) is a sectional view explaining the washing process, FIG. 7(*b*) is a sectional view explaining a drying process 1, FIG. 7(*c*) is a sectional view explaining the drying process 2, and FIG. 7(*d*) is a sectional view explaining the drying process 3.

Next the series of processes the substrate processing device will be described with reference to FIG. 6 and FIG. 7. FIG. 6 shows a timing chart for the series of processes. FIG. 7 shows the washing and drying process, FIG. 7(a) is a sectional view explaining the washing process, FIG. 7(b) is a sectional view explaining the drying process 1, FIG. 7(c) is a sectional view explaining the drying process 2, and FIG. 7(d) is a sectional view explaining the drying process 3.

Referring to FIGS. 1 and 6, first the lid 30 of the processing tank 15 is opened, and the assembly of wafers W' is accommodated in the inner tank 20. At this point, the desired chemical solution, e.g., hydrofluoric acid (HF) is supplied to the inner tank 20 from the chemical solution supply source 39 through the pipe $22_1$, which introduces the processing solution, and the processing solution supply unit 22, and the desired chemical solution is reserved in the inner tank 20. Therefore, the processing (for example, etching, hydrofluoric-acid treatment, and washing, etc.) is performed on the assembly of wafers W' according to which chemical solution is used by dipping the assembly of wafers W' in the processing solution.

After the chemical-solution processing is finished, as shown in FIG. 7(a), pure water DIW is supplied to the inner tank 20 from the pure water supply source 38 through pipe $22_1$ which introduces the processing solution, and the processing solution supply unit 22. The pure water DIW is supplied while overflowing from the upper region of the inner tank 20. The pure water DIW overflowing from the inner tank 20 flows into the outer tank 25, and the pure water DIW is discharged from the drain pipe $25_1$ through the water discharge pipe. The pure water is supplied for a relatively long time to wash out the chemical solution HF which remains in the inner tank 20.

After the washing process, in the drying process 1 shown in FIG. 7(b), the continuous supply of the pure water DIW is stopped, and the assembly of wafers W' is slowly raised from the inner tank 20 (rate is reduced) while a small amount of pure water is supplied (DIW water-saving). A small amount of IPA vapor can also be supplied into the processing tank 15 at the same time as when the assembly of wafers W' is raised.

Then, during the drying process 2 shown in FIG. 7(c), the drain mechanism valve of the outlet $21_2$ in the bottom region of the processing tank 15 is operated to rapidly discharge the processing solution, and the porous plate 28 is inserted between the inner and outer tanks 20 and 25 and the intermediate connecting member 26 by horizontally moving the porous plate 28 into the frame body $27_1$. Subsequently, the mixed gas of hot nitrogen gas $N_2$ and the IPA vapor is supplied to the inner tank 20. These operations are performed simultaneously as shown in the timing chart. The nitrogen gas $N_2$ is heated in the vapor generating tank $37_1$. In the drying process 2, the organic solvent vapor in the processing tank 15 comes into contact-with the surface of each wafer W, and the organic solvent vapor is condensed onto the surface of the wafer W to form a film of the organic solvent. When the organic solvent film is formed on the surface of the wafer W, the organic solvent is substituted for the pure water adhering to the wafer W. Therefore, the pure water flows out from the surface of the wafer W. In the drying process 3 shown in FIG. 7(d), the nitrogen gas $N_2$ is supplied in order to dry the substituted IPA, and the assembly of wafers W' is taken out from the processing tank 15 when the drying process 3 is finished.

Figure 8:
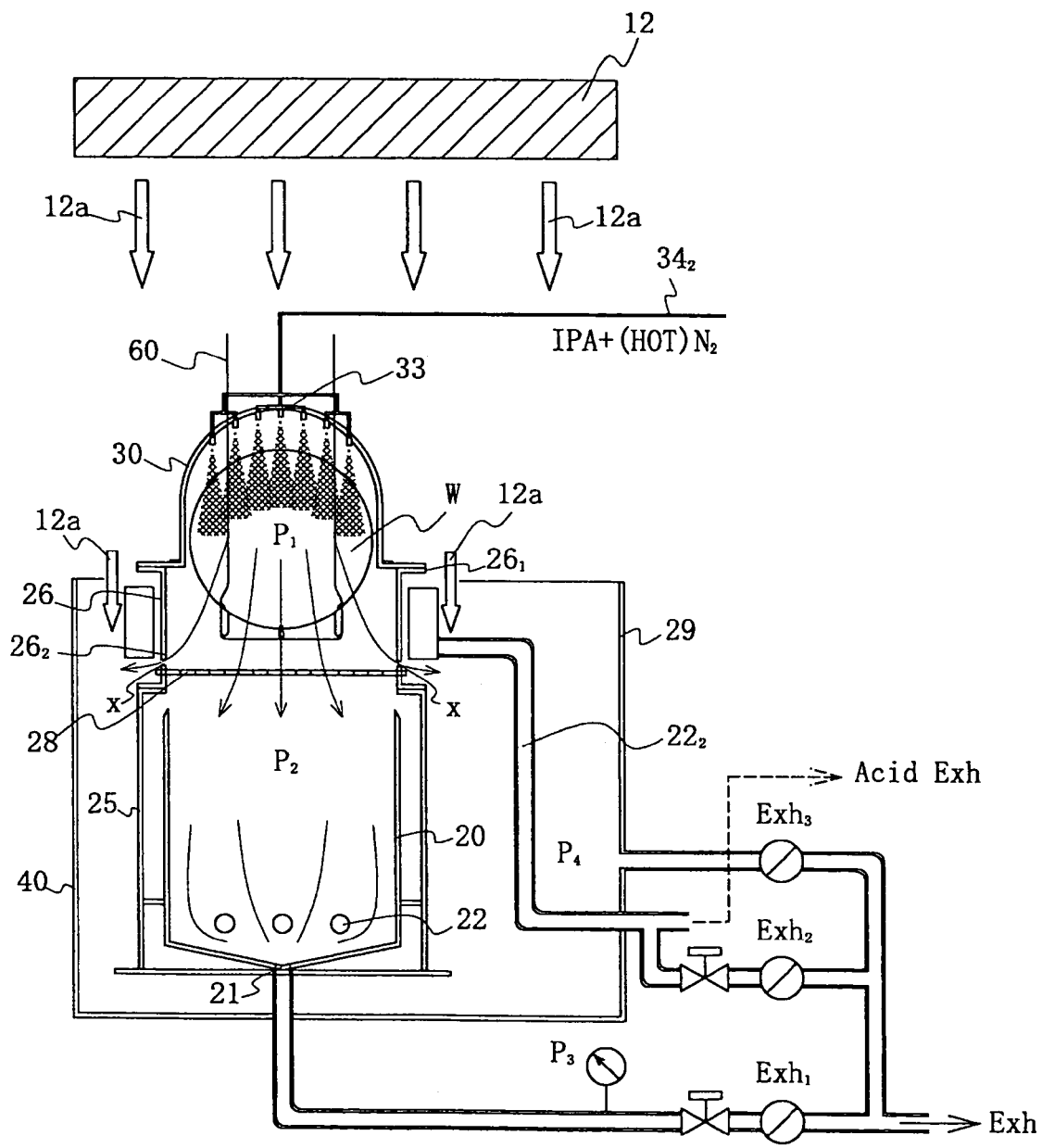
FIG. 8 is a sectional view schematically showing a flow for the drying gas in FIG. 7(*c*)
Figure 9:
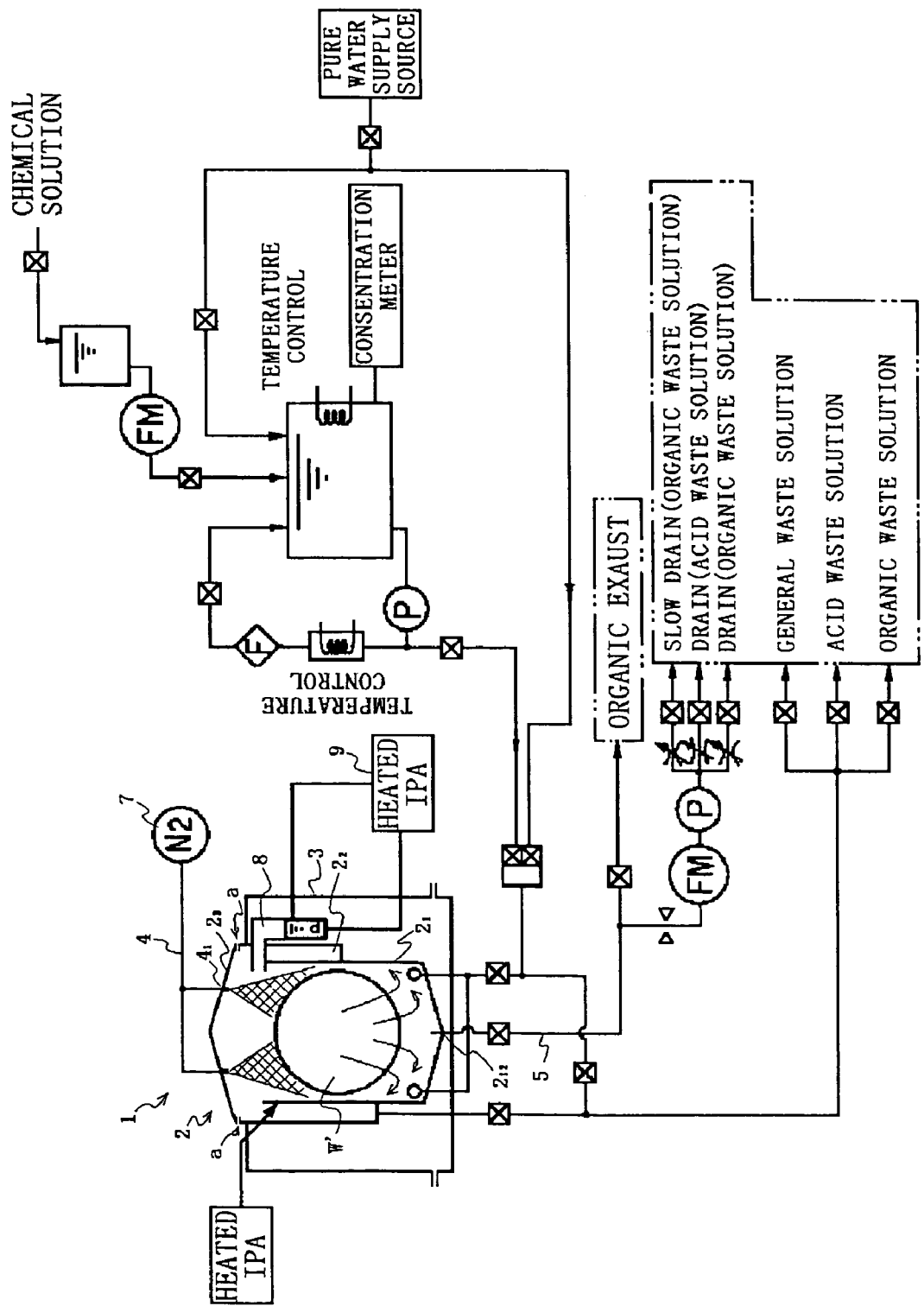
FIG. 9 is a sectional view showing the flow of the inert gas in the processing tank in the conventional substrate processing device.

When the flow of the drying gas in the drying process 2 in the above drying processes 1 to 3 is investigated, the route shown in FIG. 8 is observed. FIG. 8 is a sectional view schematically showing the flow of the drying gas in FIG. 7(c). The drying gas (IPA+hot $N_2$) is jetted from the jet nozzles 33 in the upper region of the lid 30 to the assembly of wafers W'. At this point, a clearance x is formed between the inner tank 20 and the lid 30. A completely closed state is not formed between the inner tank 20 and the lid 30, but a half-closed state is formed between the inner tank 20 and the lid 30 by the clearance x, i.e., a half-closed state is formed between drying section and the washing section. Therefore, some of the drying gas jetted to the assembly of wafers W' flows into the sink 29 from the clearance x between the inner tank 20 and the lid 30.

Further, since the processing tank 15 is placed in the air-conditioned housing chamber 11, air $12a$ is blown downward from the air conditioner 12 in the upper region of the housing chamber 11 as shown by the arrows. As a result, the drying gas emitted from the clearance x is partially exhausted through the piping $22_2$, and the remainder of the drying gas flows into the sink 29 along with the air $12a$ and exhausted by an exhaust device coupled to the sink 29. Since the drying gas jetted from the jet nozzles 33 is emitted through the clearance x, the amount of gas flowing into the inner-tank 20 is decreased by the gas emitted through the clearance x. The amount of gas emitted through the clearance x becomes relatively large. Therefore, the drying gas can be exhausted without the influence of the fluctuation in evacuating station in the exhaust processing facility.

That is, after the drying gas is jetted on the assembly of wafers W', some of the drying gas is emitted into the sink 29 through the clearance x, so that the amount of gas flowing in the inner tank 20 is decreased by the amount of gas emitted into the sink 29. Therefore, even if a fluctuation in the evacuating station exists, the drying gas can smoothly be evacuated while the fluctuation does not largely have an influence. More particularly, when the clearance x is provided, the fluctuation in the evacuating station is absorbed by the larger space including not only the inner tank and the outer tank but also the sink, which allows the influence of the fluctuation in evacuating station to be decreased compared with the case of a narrower space including only the inner tank and the outer tank. Further, since a large amount of clean air is supplied from the upper region of the housing chamber 11, the fluctuation in the evacuating station can further be decreased.

On the other hand, since plural small holes have been made in the body of the porous plate 28, the drying gas passing through the porous plate 28 is dispersed by the plural small holes, and a pressure difference is generated by the orifice effect between the lid 30 and the inner tank 20, i.e., between the lid constituting the drying chamber and the inner tank constituting the washing chamber. The drying gas in the drying chamber is evacuated while flowing smoothly down. Therefore, the pressure of the lid 30 (drying section) becomes securely higher than the pressure of the inner tank 20 (washing section).

In this state, when a pressure relationship is shown between the processing tank 15 and the sink 29, the following relationships hold:

$P_1 > P_2 > P_3 >$ pressure of evacuating station, and $P_1 > P_4 >$ pressure of evacuating station.

Where $P_1$ is the pressure of the lid 30 (drying section), $P_2$ is the pressure in the inner tank 20, $P_3$ is the pressure in the exhaust pipe, and $P_4$ is the pressure in the sink 29.

Accordingly, when the pressures in the processing tank 15 and the sink 29 satisfy the above relationships, the drying gas demonstrates a laminar flow in the processing tank 15, and the drying gas is smoothly exhausted to the outside of the tank through the exhaust pipe. Through this process, the drying gas is uniformly supplied to each individual wafer, no water mark is formed on the substrate surface, any particles can be removed, and the adhesion of particles can be also prevented. Further, the re-adhesion of particles can be suppressed because the drying gas is not circulated in the processing tank.

The invention claimed is:

1. A substrate processing method characterized by including: dividing a processing tank into a washing section and a drying section; forming a clearance in a joint between the washing section and the drying section; communicating the clearance with a sink; moving a substrate from the washing section to the drying section in drying the substrate; inserting a porous plate into the lower region where a clearance is formed; and jetting a drying gas against the substrate with the internal pressure of the drying section kept higher than that of the sink and the internal pressure of the washing section kept lower than that of the drying section.

2. The substrate processing method according to claim 1, characterized in that a processing solution supply unit and a processing solution discharge unit are independently provided in the bottom region of said washing section, and the following processes (a) to (d) are performed in washing the substrate;
(a) a process of supplying a chemical solution from the processing solution supply unit into said processing tank to reserve the chemical solution in the processing tank,
(b) a process of inputting and dipping said substrate in the processing tank to perform chemical-solution processing to the substrate for a predetermined time;
(c) a process of supplying a washing solution from the processing solution supply unit after the chemical-solution processing is finished, and of discharging the chemical solution from the processing tank through the processing solution discharge unit; and
(d) a process of stopping the supply of the washing solution after the chemical solution has been discharged.

3. The substrate processing method according to claim 2, characterized in that a drain mechanism is provided in said processing solution discharge unit, and in drying the substrate, the processing solution in said washing section is discharged for a short time by operating the drain mechanism at the same time as a porous plate is inserted between said washing section and said drying section.

4. The substrate processing method according to claim 1, characterized in that said porous plate is a punched plate in which a plurality of small holes having a predetermined diameter are punched.

\* \* \* \* \*